US006818358B1

(12) United States Patent
Lukanc et al.

(10) Patent No.: US 6,818,358 B1
(45) Date of Patent: Nov. 16, 2004

(54) METHOD OF EXTENDING THE AREAS OF CLEAR FIELD PHASE SHIFT GENERATION

(75) Inventors: Todd P. Lukanc, San Jose, CA (US); Christopher A. Spence, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 125 days.

(21) Appl. No.: 10/016,439

(22) Filed: Dec. 11, 2001

Related U.S. Application Data

(63) Continuation-in-part of application No. 09/772,577, filed on Jan. 30, 2001, now Pat. No. 6,534,224.

(51) Int. Cl.[7] .................................................. G03F 9/00
(52) U.S. Cl. ............................. 430/5; 430/30; 430/296; 430/311; 716/19; 716/20
(58) Field of Search ............................. 430/5, 30, 311, 430/296; 716/19, 20

(56) References Cited

U.S. PATENT DOCUMENTS

| 5,328,784 A | | 7/1994 | Fukuda ........................... 430/5 |
| 5,521,031 A | | 5/1996 | Tennant et al. ................. 430/5 |
| 5,573,890 A | | 11/1996 | Spence ....................... 430/311 |
| 5,619,059 A | | 4/1997 | Li et al. ....................... 257/431 |
| 5,641,593 A | | 6/1997 | Watanabe et al. ............... 430/5 |
| 5,686,208 A | * | 11/1997 | Le et al. ........................ 430/5 |
| 5,780,187 A | | 7/1998 | Pierrat ............................ 430/5 |
| 5,807,649 A | | 9/1998 | Liebmann et al. ............. 430/5 |
| 5,858,580 A | | 1/1999 | Wang et al. .................... 430/5 |
| 5,861,233 A | | 1/1999 | Sekine et al. ............... 430/296 |
| 6,013,399 A | | 1/2000 | Nguyen .......................... 430/5 |
| 6,057,063 A | * | 5/2000 | Liebmann et al. ............. 430/5 |
| 6,228,539 B1 | | 5/2001 | Wang et al. .................... 430/5 |
| 6,410,193 B1 | | 6/2002 | Stivers et al. .................. 430/5 |
| 6,493,866 B1 | * | 12/2002 | Mayhew ....................... 716/21 |
| 6,534,224 B2 | * | 3/2003 | Lukanc ........................... 430/5 |
| 6,543,045 B2 | * | 4/2003 | Ludwig et al. ............... 716/21 |
| 6,675,369 B1 | * | 1/2004 | Lukanc et al. ................ 716/21 |
| 2004/0009407 A1 | * | 1/2004 | Lukanc et al. ................. 430/5 |

FOREIGN PATENT DOCUMENTS

| EP | 0 708 367 B1 | | 1/1998 | |
| WO | WO 03/054626 | * | 7/2003 | ............. G03F/1/00 |

OTHER PUBLICATIONS

Levenson et al., "Improving Resolution in Photolithography with a Phase–Shifting Mask," IEEE Transactions On Electron Devices, vol. ED–29, No. 12, Dec. 1982, pp. 1828–1836.

Lin, B.J., "Phase–Shifting Masks Gain an Edge," Circuits & Devices, Mar. 1993, pp. 28–35.

T. Brunner et al., "170 nm gates fabricated by phase–shift mask and top anti–reflector process," 182/SPIE vol. 1927, Optical/Laser Microlithography VI, 1993, pps. 1–8.

Kurt Ronse et al., "Comparison of various phase shift strategies and application to 0.35 $\mu$m ASIC Designs," 2/SPIE vol., 1927, Optical/Laser Microlithography VI, 1993, pps. 1–15.

(List continued on next page.)

*Primary Examiner*—Mark F. Huff
*Assistant Examiner*—Nicole Barreca
(74) *Attorney, Agent, or Firm*—Foley & Lardner LLP

(57) ABSTRACT

An exemplary Full Phase patterning method involves patterning gates to increase process margins from conventional methods. This technique can define all poly patterns with a phase mask, using only a field or trim mask to resolve conflicts in the phase mask. The trim mask exposes a series of lines that either separates the different phase areas where patterns not desired or minimizes the range of sizes of the phase patterns next to a critical gate area.

20 Claims, 5 Drawing Sheets

OTHER PUBLICATIONS

J. M. Calvert et al., "Projection X-Ray Lithography With Ultrathin Imaging Layers and Selective Electroless Metallization," Optical Engineering vol. 32 No. 10, Oct. 1993., pp. 2437–2445.

H. Kyuragi et al., "Synchotron Radiation–Excited Chemical Vapor Deposition of Silicon Nitride Films from a $SiH_4$ + $NH_3$ Gas Mixture," Journal of the Electrochemical Society, vol.138 No. 11, Nov. 1991, pp. 3412–3416.

Y. Matsui et al., "Low–Temperature Growth of $SiO_2$ Thin Film by Photo–Induced Chemical Vapor Deposition Using Synchrotron Radiation," Japanese Journal of Applied Physics, Part I, vol. 31 n.6B, Jun. 1992, pp. 1972–1978.

J. F. Moore et al., "Deposition of Dielectric Thin Films by Irradiation of Condensed Reactant Mixtures," Materials Research Society Symposium Proceedings, vol. 335, 1994, pp. 81–86.

I. Nishiyama et al., "Photon Energy Dependence of Synchrotron Radiation Induced Growth Suppression and Initiation in Al Chemical Vapor Deposition II. Surface Analysis by Auger Electron Spectroscopy," Applied Surface Science, vol. 103, 1996, pp. 299–306.

O. R. Wood II et al., "Use of Attenuated Phase Masks in Extreme Ultraviolet Lithography," Journal of Vacuum Science and Technology B, vol. 15, No. 6, Nov./Dec. 1997, pp. 2448–2451.

R. Zanoni et al., "Synchrotron–Radiation–Stimulated Tungsten Deposition on Silicon from $W(CO)_6$," Journal of Vacuum Science and Technology A, vol. 9, No. 3, May/Jun. 1991, pp. 931–934.

Chen HL et al., "Simulation on a New Reflection Type Attenuated Phase Shifting Mask for Extreme Ultraviolet Lithography", Emerging Lithographic Technologies III, Santa Clara, CA, USA, Mar. 15–17, 1999, vol. 3676, pp. 578–586, XP002230586, Proceedings of the SPIE—The International Society for Optical Engineering, 1999, SPIE— Int. Soc. Opt. Eng., USA.

* cited by examiner

METHOD OF EXTENDING THE AREAS OF CLEAR FIELD PHASE SHIFT GENERATION

CROSS REFERENCE TO RELATED APPLICATIONS

This application is related to U.S. patent application Ser. No. 10/016,710, entitled METHOD OF ENHANCING CLEAR FIELD PHASE SHIFT MASKS WITH CHROME BORDER AROUND PHASE 180 REGIONS; U.S. patent application Ser. No. 10/016,702, entitled METHOD OF ENHANCING CLEAR FIELD PHASE SHIFT MASKS BY ADDING PARALLEL LINE TO PHASE 0 REGION; U.S. patent application Ser. No. 10/016,273, entitled METHOD OF ENHANCING CLEAR FIELD PHASE SHIFT MASKS WITH BORDER REGIONS AROUND PHASE 0 AND PHASE 180 REGIONS; and U.S. patent application Ser. No. 10/016,441, entitled METHOD OF ENHANCING CLEAR FIELD PHASE SHIFT MASKS WITH BORDER AROUND OUTSIDE EDGES OF PHASE ZERO REGIONS, all of which are assigned to the same assignee as the present application.

This application is a continuation-in-part (CIP) application claiming priority under 35 U.S.C. 120 to U.S. patent application Ser. No. 09/772,577, filed Jan. 30, 2001, now U.S. Pat. No. 6,534,224, entitled PHASE SHIFT MASK AND SYSTEM AND METHOD FOR MAKING THE SAME, by Todd Lukanc, one of the inventors of the present application.

FIELD OF THE INVENTION

The present invention relates generally to integrated circuits and methods of manufacturing integrated circuits. More particularly, the present invention relates to generating phase shifting patterns to improve the patterning of gates and other layers, structures, or regions needing sub-nominal dimensions.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC.

One limitation to achieving smaller sizes of IC device features is the capability of conventional lithography. Lithography is the process by which a pattern or image is transferred from one medium to another. Conventional IC lithography uses ultra-violet (UV) sensitive photoresist. Ultra-violet light is projected to the photoresist through a reticle or mask to create device patterns on an IC. Conventional IC lithographic processes are limited in their ability to print small features, such as contacts, trenches, polysilicon lines or gate structures.

Generally, conventional lithographic processes (e.g., projection lithography and EUV lithography) do not have sufficient resolution and accuracy to consistently fabricate small features of minimum size. Resolution can be adversely impacted by a number of phenomena including: diffraction of light, lens aberrations, mechanical stability, contamination, optical properties of resist material, resist contrast, resist swelling, thermal flow of resist, etc. As such, the critical dimensions of contacts, trenches, gates, and, thus, IC devices, are limited in how small they can be.

For example, at integrated circuit design feature sizes of 0.5 microns or less, the best resolution for optical lithography technique requires a maximum obtainable numerical aperture (NA) of the lens systems. Superior focus cannot be obtained when good resolution is obtained and vice versa because the depth of field of the lens system is inversely proportional to the NA and the surface of the integrated circuit cannot be optically flat. Consequently, as the minimum realizable dimension is reduced in manufacturing processes for semiconductors, the limits of conventional optical lithography technology are being reached. In particular, as the minimum dimension approaches 0.1 microns, traditional optical lithography techniques may not work effectively.

With the desire of reducing feature size, integrated circuit (IC) manufacturers established a technique called "phase shifting." In phase shifting, destructive interference caused by two adjacent translucent areas in an optical lithography mask is used to create an unexposed area on the photoresist layer. Phase shifting exploits a phenomenon in which light passing through translucent regions on a mask exhibits a wave characteristic such that the phase of the light exiting from the mask material is a function of the distance the light travels through the mask material. This distance is equal to the thickness of the mask material.

Phase shifting allows for an enhancement of the quality of the image produced by a mask. A desired unexposed area on the photoresist layer can be produced through the interference of light from adjacent translucent areas having the property that the phase of the light passing through adjacent apertures is shifted by 180 degrees relative to each other. A dark, unexposed area will be formed on the photoresist layer along the boundary of the phase shifted areas caused by the destructive interference of the light which passes through them.

Phase shifting masks are well known and have been employed in various configurations as set out by B. J. Lin in the article, "Phase-Shifting Masks Gain an Edge," Circuits and Devices, March 1993, pp. 28–35. The configuration described above has been called alternating phase shift masking (PSM).

In some cases, phase shifting algorithms employed to design phase shifting masks define a phase shifting area that extends just beyond active regions of an active layer. The remaining length of polysilicon, for example, is typically defined by a field or trim mask. However, this approach is not without its problems. For example, alignment offsets between phase shift masks and field masks may result in kinks or pinched regions in the polysilicon lines as they transition from the phase shifting area to the field mask areas. Also, since the field masks are employed to print the dense, narrow lines of polysilicon beyond the active regions, the field masks become as critical and exacting as the phase shift masks.

Phase shift patterning of polysilicon or "poly" layouts has been proven to be an enhancement in both manufacturing as well as enabling smaller patterned lines and narrow pitches. These items can be more enhanced as the desired linewidth and pitch shrinks, yet there can be some risks and complications.

Conventional patterning with phase shifters has been done by shifting only the areas of minimum desired dimensions—usually the poly gate or narrow poly that is over the active pattern. The patterned poly lines that are away from the active regions are usually laid out with similar design rules as that of the patterned poly lines on active regions. As such, there can be many transitions between the phase shifted patterning and binary patterning. Transition areas can result in linewidth loss, increasing device leakage.

Current alternating phase shift masking (PSM) designs for polysilicon layers often focus on enabling gate shrink by applying alternating phase shift regions around the gate region (i.e., the intersection of the polysilicon and active layers). One such alternating PSM design is described in U.S. Pat. No. 5,573,890 entitled METHOD OF OPTICAL LITHOGRAPHY USING PHASE SHIFT MASKING, by Christopher A. Spence (one of the inventors of the present application) and assigned to the assignee of the present application.

An enhanced phase shift approach was developed to reduce the transition regions and move those regions away from the active edge to wider poly or corners of poly patterns where linewidth loss would have little or no impact. Examples of this enhanced phase shifting approach are described in U.S. patent application Ser. No. 09/772,577, entitled PHASE SHIFT MASK AND SYSTEM AND METHOD FOR MAKING SAME, filed on Jan. 30, 2001, by Todd P. Lukanc (one of the inventors of the present application) and assigned to the assignee of the present application, incorporated herein by reference.

The specification of the Lukanc patent application describes binary and phase masks that define parts of the poly pattern and need to have very controlled critical dimensions (CDs). The phase mask basically has long narrow openings that are easy to pattern but the binary mask has both small openings as well as small lines, in both isolated and dense areas. As such, the patterning of the binary mask can be complicated and the manufacturing window of this technique can be limited. In both the simple phase and the enhanced phase methods, both masks are critical and have different optimized illumination and patterning conditions.

Other known systems use a "node" based approach rather than a gate-specific approach to generate a phase assignment that attempts to apply phase shifting to all minimum poly geometries (both field and gate). Two examples of the "node" based approach include, for example, Galan et al. "Applications of Alternating-Type Phase Shift Mask to Polysilicon Level for Random Logic Circuits," Jpn. J. Appl. Phys. Vol. 33 (1994) pp. 6779–6784, December 1994, and U.S. Pat. No. 5,807,649 entitled LITHOGRAPHIC PATTERNING METHOD AND MASK SET THEREFOR WITH LIGHT FIELD TRIM MASK, by Liebmann et al.

In view of the known art, there is a need for improvements to the clear field phase shifting mask (PSM) and field or trim mask approach that result in simpler and more reliable mask fabrication and in better wafer imaging. Further, there is a need to minimize variations or use of optical proximity correction (OPC) by enclosing phase shift masking features. Yet further, there is a need to generate phase shifting patterns to improve the patterning of gates and other layers needing sub-nominal dimensions.

SUMMARY OF THE INVENTION

An exemplary embodiment relates to a method of patterning gates to increase process margins from conventional methods. This technique can be called Full Phase patterning and can define all poly patterns with a phase mask, using only a field or trim mask to resolve conflicts in the phase mask. The trim mask can expose a series of lines that either separates the different phase areas where patterns are not desired or minimizes the range of sizes of the phase patterns next to a critical gate area.

An exemplary embodiment of Full Phase pattern generation can be carried out as follows. First the critical poly regions or other region desired to be defined by phase shifting and the poly adjoining are defined. Phase regions are then created on either side of these critical poly regions. These phase regions are assigned phase angles such that regions on either side of the critical poly are 180 degrees out of phase. A next step is to define all remaining poly edges and join as much of these edges to the phase assigned areas as possible. The phase transitions are kept at wide poly areas or at corners or line ends. Next, a boundary around the phase 180 edges not defining the poly edge is defined, and then all area outside that boundary is defined as phase 0. Subnominal lines, spaces, and other violation areas can be cured and optical proximity correction (OPC) can be applied to appropriate areas. Two masks are created. The first is a substantially clear-field phase mask that fully defines the poly pattern and additional artifacts, such as, phase conflicts and phase breaks. The second, a trim mask, is a substantially dark-field mask which removes the phase conflict and phase break regions without impacting the phase-defined poly pattern. The critical patterns on both masks are narrow openings and, thus, have almost identical optimized illumination and patterning conditions.

Another exemplary embodiment is related to a method of defining a phase shifting mask. This method can include defining critical poly regions and adjoining poly where the critical poly regions are regions desired to be defined by phase shifting, creating phase regions on either side of the critical poly regions, assigning phase angles to the phase regions such that the phase regions have either a first phase angle or a second phase angle, defining edges of the phase regions being assigned the second phase angle where the edges do not define a poly pattern, defining a boundary region around the defined edges, and defining regions outside a desired poly pattern, phase regions, and boundary region to have the first phase angle. The desired poly pattern, phase regions, and boundary region define a mask.

Another exemplary embodiment is related to a method of generating phase shifting pattern to improve the patterning of gates and other layers needing sub-nominal dimensions. This method can include defining critical areas, creating phase regions on either side of these critical areas, assigning opposite phase polarities to each side of the critical areas, enhancing the area of the phase regions to reduce patterning errors, defining break regions where phase transitions will be easy to remove later with the trim mask, generating polygons to define other edges and excluding the defined break regions, merging the generated polygons with enhanced critical areas having a common phase polarity, separating the polygons having interactions with more than one polarity into portions which are merged into regions having only one polarity, constructing a boundary region outside of phase 180 regions, and defining undefined regions as phase zero regions.

Another exemplary embodiment is related to a method of enhancing clear field phase shift masks with a border around outside edges. This method can include assigning phase polarities to the phase regions, defining the edges of the phase regions not defining the poly, establishing a boundary region around these defined edges, and assigning outside of the established boundary to have phase zero.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
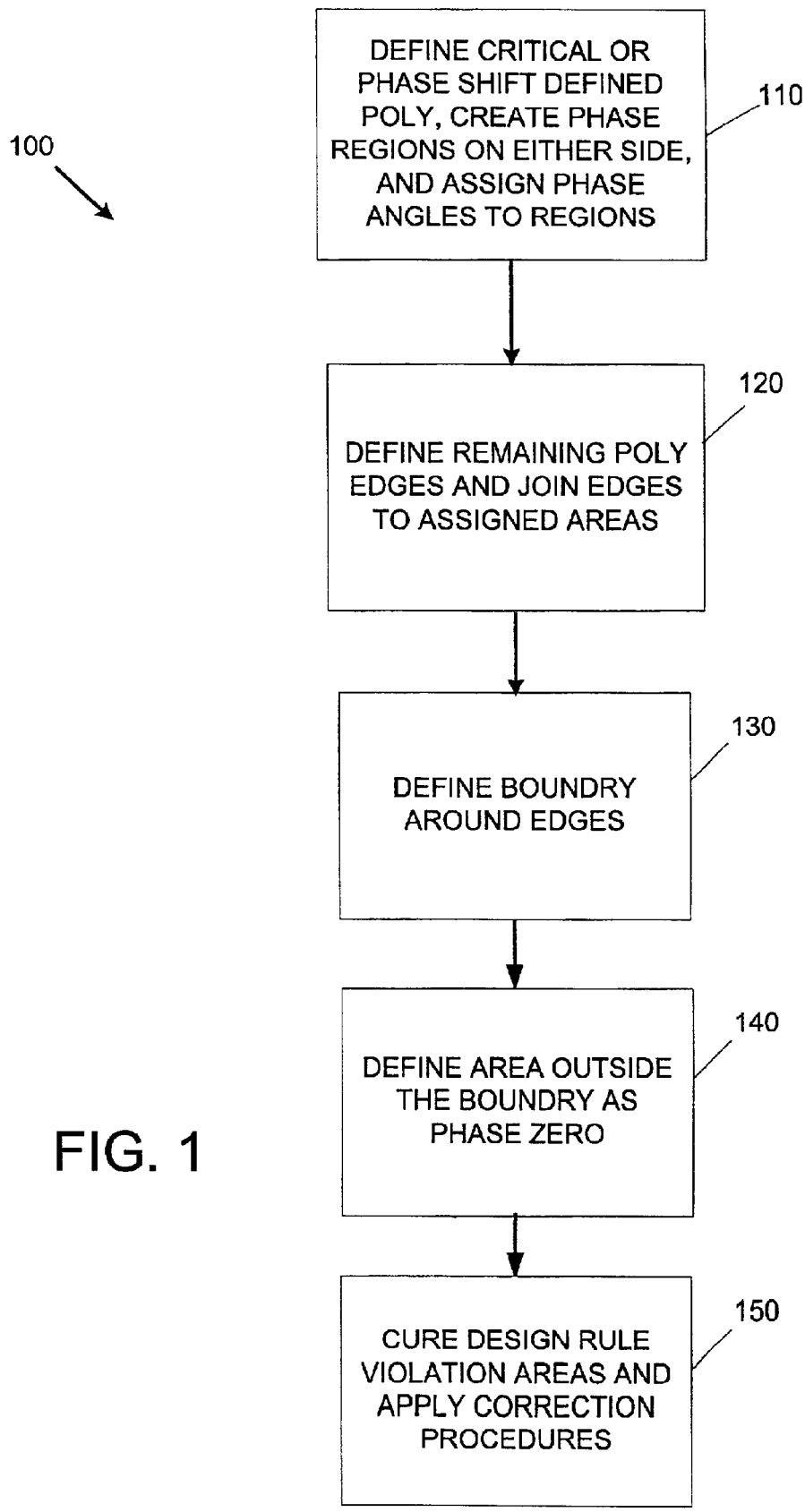
FIG. 1 is a flow diagram illustrating steps in a patterning method according to an exemplary embodiment.
Figure 2:
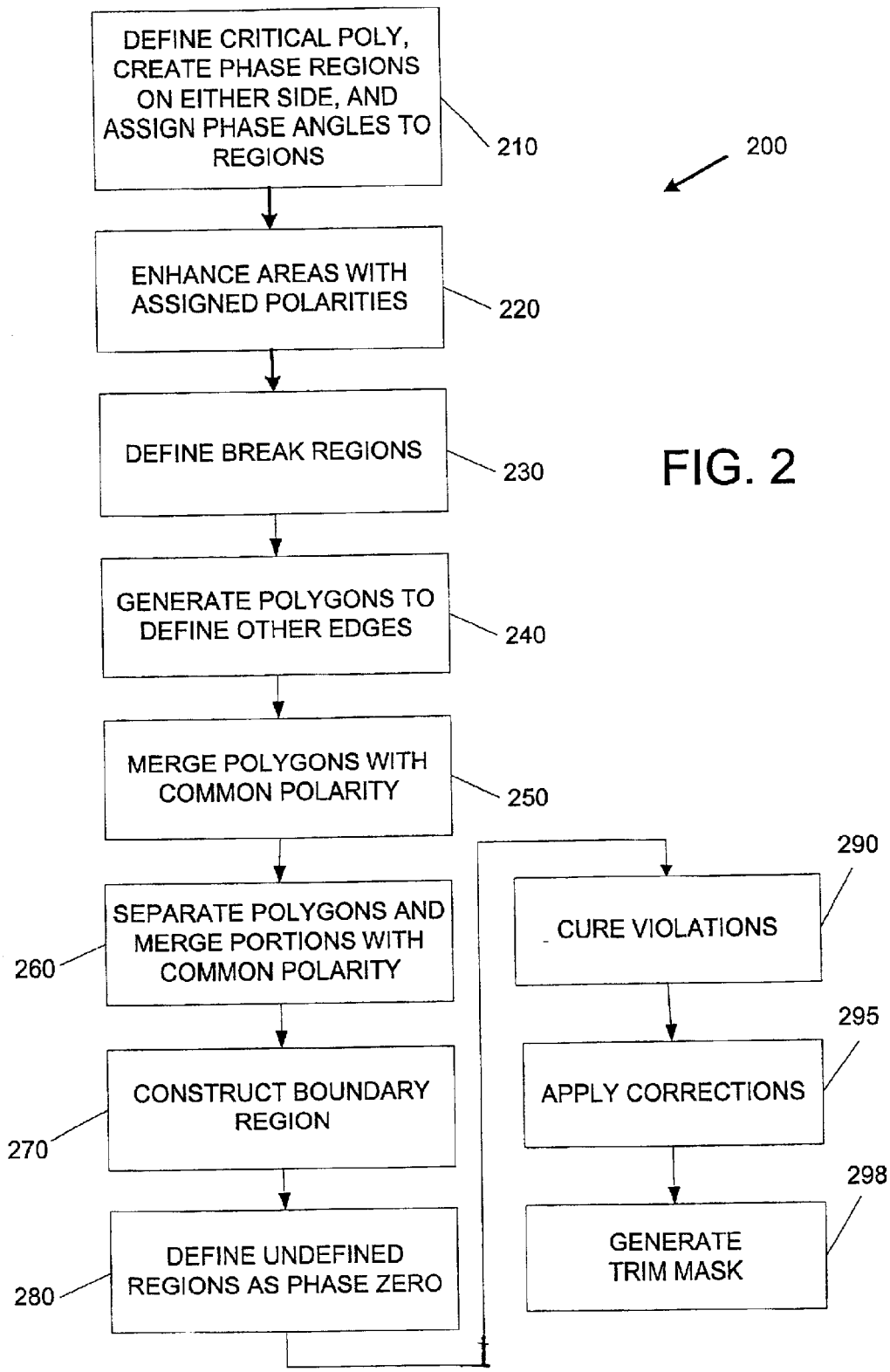
FIG. 2 is a flow diagram illustrating steps in a patterning method according to another exemplary embodiment.

FIGS. 1 and 2 provide flow diagrams showing steps in the formation or design of exemplary phase shifting masks. Advantageously, the addition of a boundary region around the entire phase 0 pattern defining polygons improves gate width control, line end pattern definition, and the manufacturability and patterning process window. This added boundary region balances the "light" on both sides of the line ends resulting in a more predictable final resist pattern. The boundary region also improves the control of the gate width by reducing the coma effect of the stepper. Another advantage is that most of the boundary regions can be merged into long serpentine features that are easier to pattern than small holes.

FIG. 1 illustrates a flow diagram 100 of steps in an exemplary method of phase shift mask formation or design. Advantageously, the method increases the process margins from those of conventional methods and systems. The method can include defining all poly patterns with a phase mask and uses the field or trim mask to resolve conflicts in the phase mask. In one embodiment, only the field or trim mask is used to resolve conflicts in the phase mask. The trim mask exposes a series of lines that either separates the different phase areas where patterns are not desired or minimizes the range of sizes of the phase patterns next to a critical gate area.

In a step 110, phase regions are created on either side of critical poly regions and the poly adjoining these regions either by hand or by a computer algorithm. These defined areas are assigned phase angles (e.g., either 0 or 180 degrees). After step 110, a step 120 is performed in which all remaining poly edges are defined and phase regions are created along as much of these edges as possible without opposite phases touching. The areas of phase transitions are kept at wide poly areas or at corners or line ends. For example, wide poly areas can be defined as 2 times the minimum poly width in thickness.

In a step 130, a boundary around the phase 180 edges not defining the poly edge is defined, and then in a step 140, all area outside that boundary is defined as phase 0. After step 140, a step 150 is performed in which now that the mask is basically defined, subnominal lines, spaces, and other violation areas can be cured and optical proximity correction (OPC) can be applied to appropriate areas. The result is a mainly clear phase mask that fully defines the poly pattern leaving only phase conflicts or phase breaks as artifacts and a substantially dark trim mask that cleans up the conflict and boundary areas without impacting the phase defined poly pattern. The critical patterns on both masks are narrow openings and, thus, have almost identical optimized illumination and patterning conditions.

In yet another exemplary embodiment, the phase 180 regions and boundary regions are defined only around the active gate areas. As such, the phase 180 regions are used to only define the active gate areas and phase 0 defines all other areas. By adding the boundary regions around the phase 180 areas, the mask manufacturing and inspecting are improved.

Advantageously, a boundary region around the entire phase 0 pattern improves gate width control, line end pattern definition, and the manufacturability and patterning process window. This added boundary region balances the "light" on both sides of the line ends resulting in a more predictable final resist pattern. The boundary region also improves the control of the gate width by reducing the coma effect of the stepper.

Referring now to FIG. 2, a flowchart 200 illustrates another exemplary process of phase mask formation or design. In a step 210, the critical gate areas are defined and phase polarities are assigned to them by hand or by a computer algorithm. In an exemplary embodiment, a mask database manipulation software tool can be used. After step 210, a step 220 can be performed in which the areas assigned polarities, or phase definition areas, are enhanced. Enhanced means extended or expanded to include more area.

In a step 230, break regions are defined for patterns not defined in step 220 for which phase transitions are likely to occur. For example, phase transitions can occur at line ends, at corners or at wide lines regions. Such break locations are regions having a width such that they can be patterned and inspected. After a step 230, a step 240 can be performed in which polygons are generated to define all other edges (e.g., field edges) of the pattern that are not defined in steps 220 and 230.

After step 240, a step 250 can be performed in which polygon regions from step 240 that interact with only one phase polarity (either phase 0 or phase 180) are merged with polygons of step 220 with the same polarity.

After step 250, a step 260 is performed in which polygons from step 240 that interact with both polarities of phase defined in step 220 are broken or separated such that the portions can be merged with only one polarity.

In a step 270, a boundary region is constructed outside of phase 180 polarity regions from step 260 and a boundary region outside the phase 0 polygons regions of step 260. The width of the boundary region is preferably similar to the widths of step 230. The boundary regions and break regions are preferably merged where possible to make patterning easier.

In a step 280, regions not defined as a desired final pattern, phase 180 polygons, phase 180 border regions, or break regions are defined as phase 0 regions. In a step 290, clean up steps are performed to "cure" design rule violations or areas that would create mask generation issues. In a step 295, optical proximity and process corrections are applied to the phase regions to allow proper pattern generation.

In a step 298, a trim mask is generated to remove undesired patterns between the phase 0 and phase 180 regions of the phase mask outside of the desired final pattern. This generation is done by oversizing the boundary and break regions.

Advantageously, the process described with reference to the FIGS. 1-2 improves gate width control, line end pattern definitions, and the patterning process window. Further, the process can minimize the number of transition regions where bridging or pinching is possible. Moreover, the process can make the critical piece of the trim mask similar to that of the phase mask, namely a relatively narrow opening in the chrome mask (or a trench). Making the critical piece of trim mask similar to the phase mask has an advantage of making the optimized illumination conditions of the phase mask more similar to or the same as the trim mask. By doing this, the stepper does not have to change settings (e.g., numerical aperture or partial coherence or focus or exposure dose).

Figure 3:
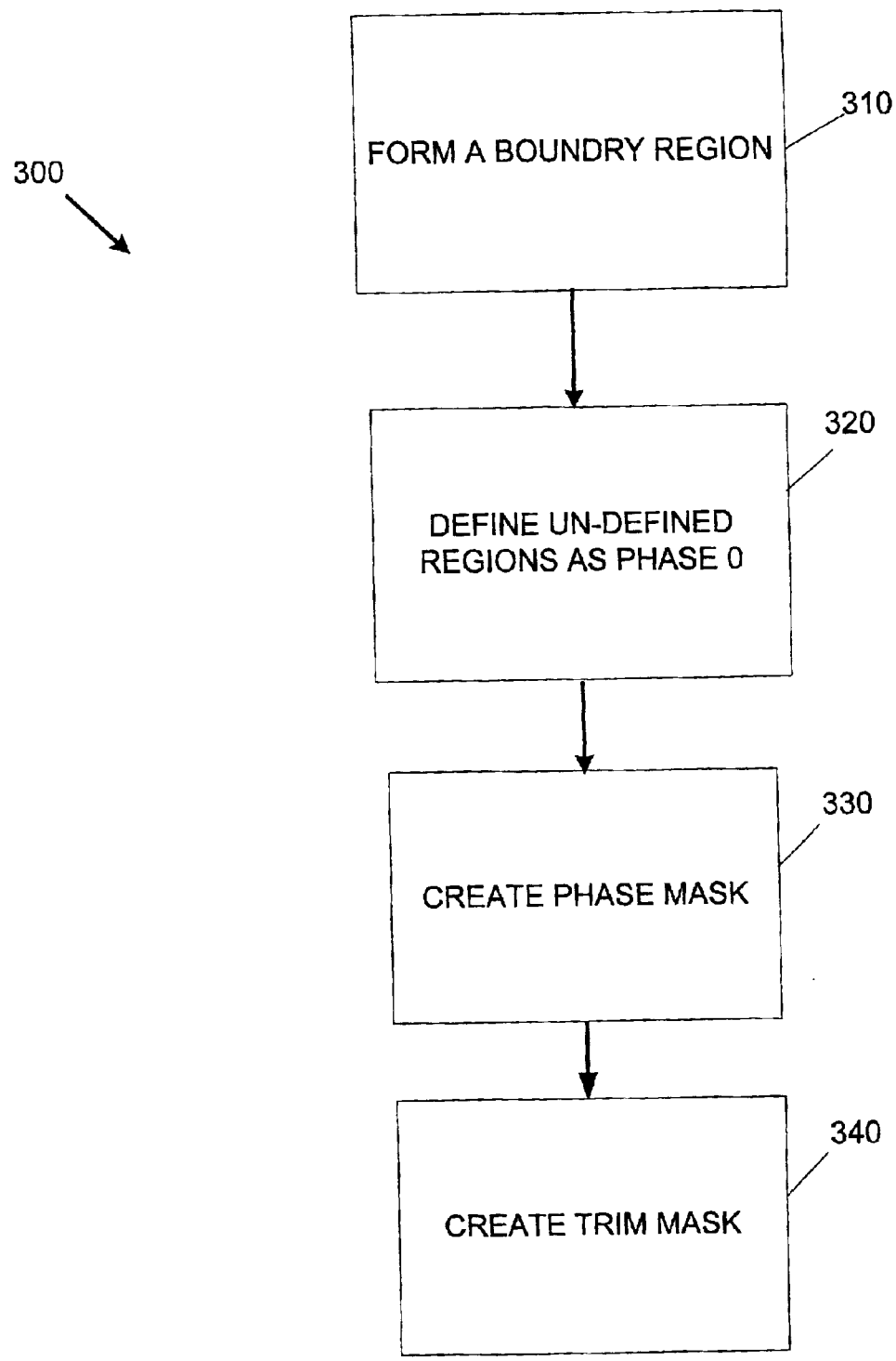
FIG. 3 is a flow diagram illustrating steps in a method of forming a phase shift mask according to an exemplary embodiment.

FIG. 3 illustrates a flow diagram 300 depicting exemplary steps in the formation or design of a phase shifting mask (PSM) and a field or trim mask. A set of previously defined phase 0 or phase 180 regions on a phase mask identifies a critical poly section. These phase 0 or phase 180 regions can be created by hand drawing, by using a currently available software program, or by creating an optimized program to define the regions. In exemplary embodiments, the phase 0 or phase 180 regions are formed or designed in a process, such as, the processes described with reference to FIG. 1 or FIG. 2.

In a step 310, a chrome boundary region is formed on the phase mask outside phase 180 region edges of the previously defined phase 180 regions that are not defining a final poly pattern. This chrome boundary region can be defined by either hand drawing or by using a computer software program. Advantageously, this chrome boundary region makes it easy to inspect the mask, and easy to pattern the phase etch step of making the mask. In a step 320, all regions not defined (either as the final poly pattern or phase 180 regions or chrome boundary regions) are defined as phase 0.

In a step 330, the chrome is patterned and etched on the mask. As part of the chrome defining process or after the chrome is patterned, a layer of resist is coated and sections of the resist are selectively removed in areas where phase 180 sections are to be formed. In an exemplary embodiment, an oversized phase 180 pattern, or a phase etch region, is defined to allow the resist to be removed and the quartz to be etched. This oversized resist pattern covers any openings in the chrome where it is desired to avoid etching. A dry or wet etch can be used to etch the quartz to a lesser thickness in the formation of the phase 180 regions. The formation of phase 180 sections and phase etch regions are further described with reference to FIG. 4.

In a step 340, the trim mask is formed to have openings that are oversized versions of the boundary chrome regions outside the final poly pattern. The openings of the trim mask are oversized because their size is slightly larger in area than the boundary regions. In the trim masking process, the openings of the trim mask are placed over these slightly smaller boundary regions. An exemplary trim mask is described with reference to FIG. 5.

Figure 4:
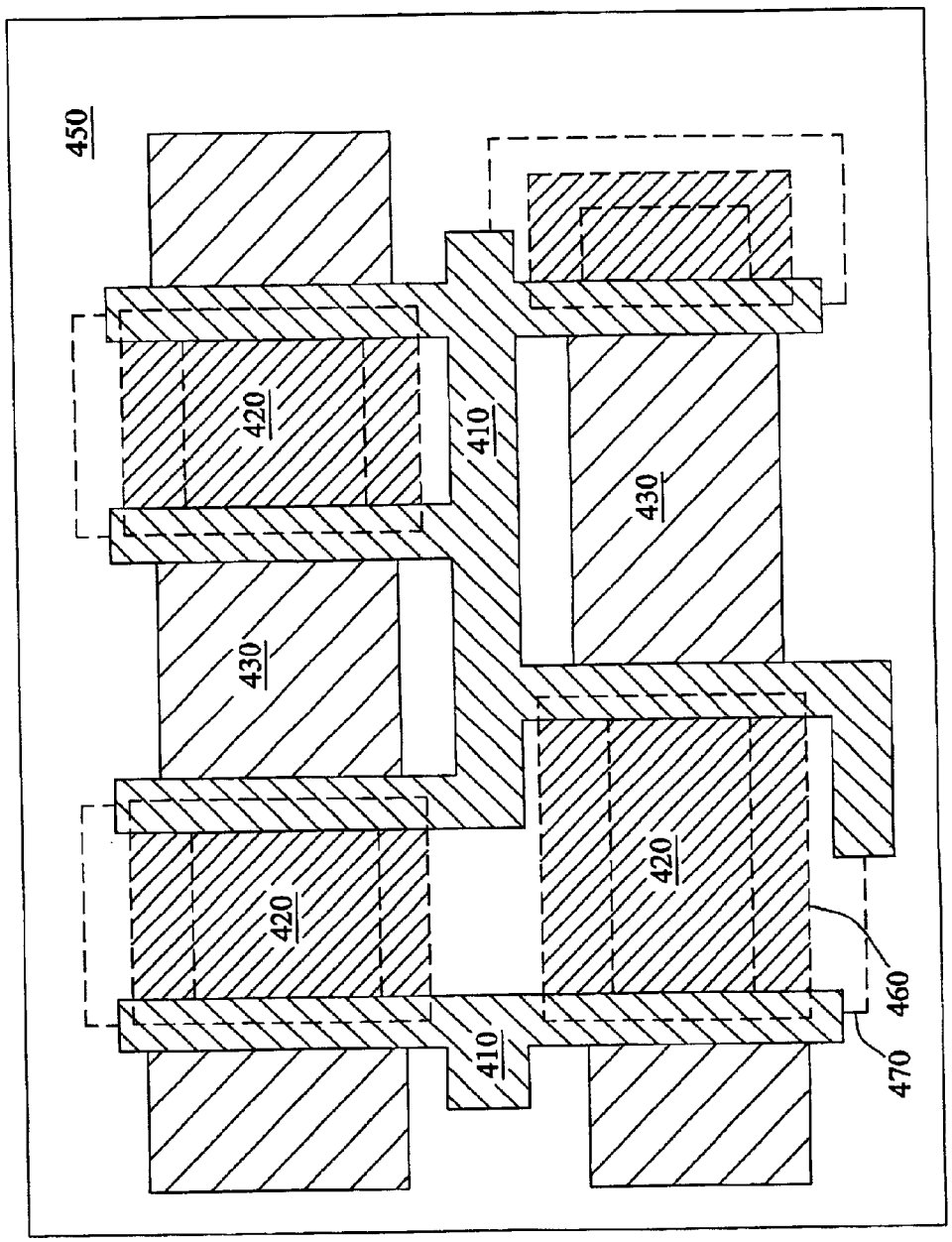
FIG. 4 is a top planar view of a phase shift mask design in accordance with an exemplary embodiment.

FIG. 4 illustrates a plan view of a phase mask 400 formed or designed utilizing the process described with reference to FIG. 3. Phase mask 400 includes poly regions 410, phase 180 regions 420, and phase 0 regions 430. Poly regions 410 (depicted in FIG. 4 as dotted areas) are critical poly sections. Phase 180 regions 420 and phase 0 regions 430 help to define poly regions 410 and can be created by hand or using a computer software program configured for the designing of phase masks. Phase mask 400 also can include a region 450 outside of defined areas. In an exemplary embodiment, region 450 (depicted in FIG. 4 as a gray back-hashed area) is assigned a phase of zero.

Phase etch regions 460 (depicted in FIG. 2 using a bold dashed line) are areas that define a pattern used in the formation of phase 180 regions 420. Advantageously, the positions of phase etch regions 460 are self-aligned to the chrome pattern as to avoid misplacement of the etch pattern relative to the original chrome pattern. In an alternative embodiment, it is possible to make the etch profile such that it partially goes underneath the chrome to partially hide the etch profile. The partially hidden etch profile allows for some variation in sidewall profiles.

Trim mask openings 470 (depicted in FIG. 4 using a dotted line) define an area that is exposed when the field or trim mask is applied. An exemplary trim mask corresponding to trim mask openings 470 is described with reference to FIG. 5. Trim mask openings 470 are configured to cover interfaces between phase 180 regions and phase 0 regions and correct for artifacts. For example, phase 180 regions 420 and phase 0 region 450 are adjacent to each other at several places on phase mask 400 and artifacts can be created at the locations. Advantageously, trim mask openings 470 help to correct for such artifacts.

Figure 5:
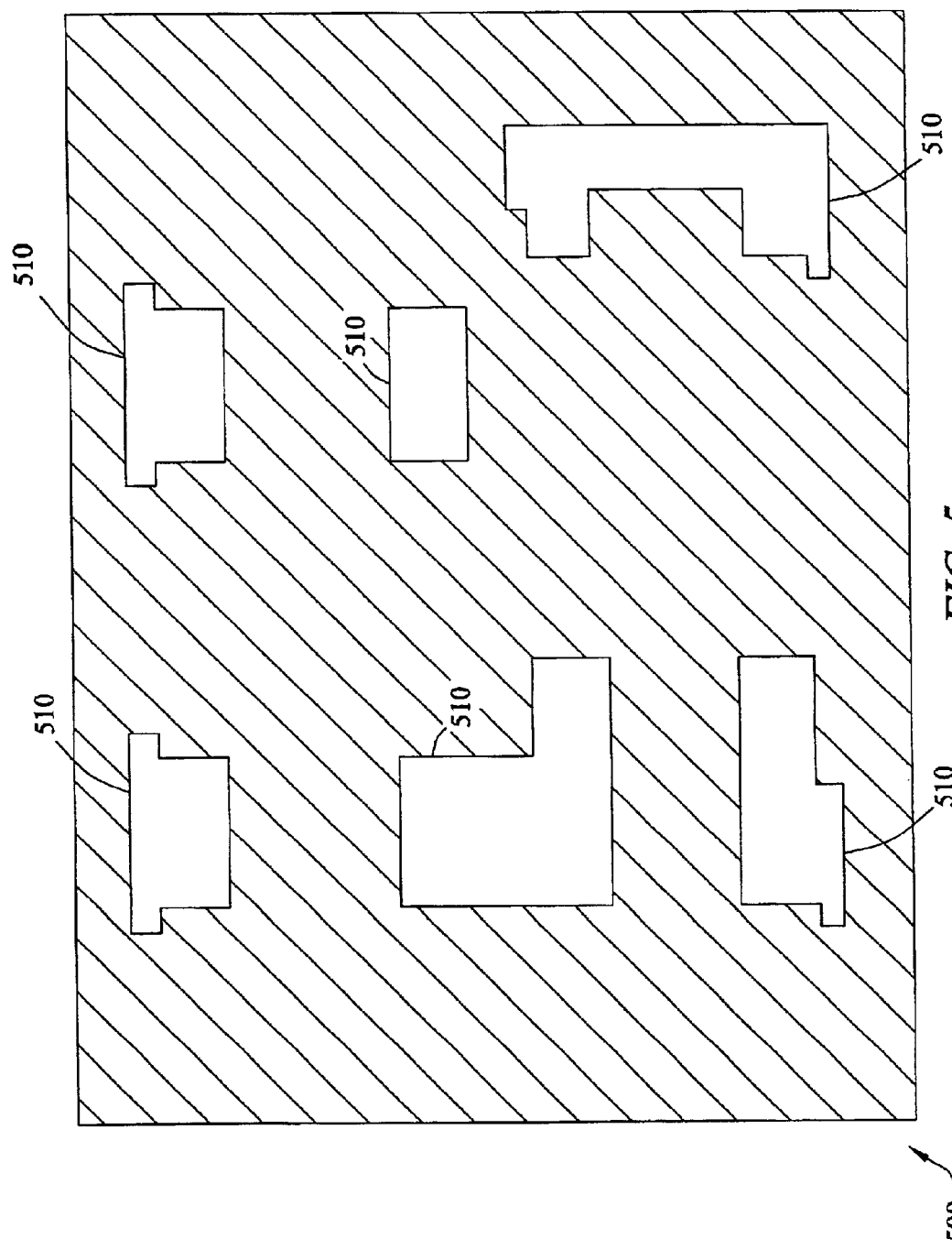
FIG. 5 is a top planar view of a field or trim mask design configured for use with the phase shift mask design of FIG. 4 in accordance with an exemplary embodiment.

FIG. 5 illustrates a plan view of a field or trim mask 500. Trim mask 500 is configured for use with phase mask 400 described with reference to FIG. 4. Trim mask 500 includes openings 510 corresponding to trim mask opening 470 in FIG. 4.

While the exemplary embodiments illustrated in the FIGURES and described above are presently preferred, it should be understood that these embodiments are offered by way of example only. Other embodiments may include, for example, different techniques for creating phase shifting regions. The invention is not limited to a particular embodiment, but extends to various modifications, combinations, and permutations that nevertheless fall within the scope and spirit of the appended claims.

What is claimed is:

1. A method of defining a phase shifting mask, the method comprising:
    defining critical poly regions and adjoining poly, the critical poly regions being regions desired to be defined by phase shifting;
    creating phase regions on either side of the critical poly regions;
    assigning phase angles to the phase regions such that the phase regions have either a first phase angle or a second phase angle;
    defining edges of the phase regions being assigned the second phase angle, the edges not defining a poly pattern;
    defining a boundary region around the defined edges; and
    defining regions outside a desired poly pattern, phase regions, and boundary region to have the first phase angle, wherein the desired poly pattern, phase regions, and boundary region define a mask.

2. The method of claim 1, further comprising enhancing the phase regions assigned a phase angle.

3. The method of claim 1, wherein enhancing the phase regions assigned a phase angle includes reducing the effect of transition regions by moving transition regions away from the critical poly regions.

4. The method of claim 1, wherein the first phase angle and the second phase angle of the phase regions are assigned phase angles 180 degrees from each other.

5. The method of claim 1, wherein the step of defining a boundary around the defined edges includes defining a boundary around edges having phase 180.

6. The method of claim 1, wherein the step of defining a boundary around the defined edges comprises forming a chrome path.

7. The method of claim 1, further comprising defining break locations where phase transitions are most likely to occur.

8. The method of claim 7, wherein the break locations have a width that permits patterning and inspection.

9. The method of claim 1, further comprising generating a trim mask to remove undesired patterns between regions of the first phase angle and the second phase angle.

10. A method of generating phase shifting pattern to improve the patterning of gates and other layers needing sub-nominal dimensions, the method comprising:

defining critical areas;

creating phase areas on either side of the critical areas;

assigning opposite phase polarities to the phase areas on each side of the critical areas;

enhancing phase areas with assigned phase polarities;

defining break regions where phase transitions are likely to occur;

generating polygons to define other edges and excluding the defined break regions;

merging the generated polygons with enhanced critical gate areas having a common phase polarity;

separating the polygons having interactions with more than one polarity into portions which are merged into regions having only one polarity;

constructing a boundary region around phase 180 regions; and defining undefined regions as phase 0 regions.

11. The method of claim 10, further comprising:

correcting design rule violations; and applying optical proximity and process corrections to phase regions to allow proper pattern generation.

12. The method of claim 11, further comprising generating a trim mask to remove undesired patterns between phase 0 and phase 180 regions outside of a desired pattern.

13. The method of claim 12, wherein the generating is done by oversizing boundary and break regions.

14. The method of claim 10, wherein the break regions are about a minimum width of a desired poly pattern.

15. The method of claim 10, wherein enhancing critical areas with assigned phase polarities includes defining edges to the critical areas.

16. A method of enhancing clear field phase shift masks with a border around outside edges, the method comprising:

providing phase regions on sides of critical mask features;

assigning phase polarities to phase regions;

defining edges of the assigned phase regions;

establishing a boundary around the defined edges; and assigning area outside of the established boundary to have phase zero.

17. The method of claim 16, wherein defining edges of the assigned phase regions includes defining break regions where phase transitions occur and generating polygons including edges but excluding break regions, wherein the polygons are merged with the assigned phase regions.

18. The method of claim 17, further comprising curing design rule violations and applying correction procedures.

19. The method of claim 17, further comprising generating a trim mask to remove undesired patterns between phase 0 and phase 180 regions.

20. The method of claim 19, wherein the generating is done by oversizing the boundary and break regions.

* * * * *